United States Patent
Gao et al.

(10) Patent No.: US 8,593,146 B2
(45) Date of Patent: *Nov. 26, 2013

(54) CRYOGENICALLY COOLED SUPERCONDUCTOR GRADIENT COIL MODULE FOR MAGNETIC RESONANCE IMAGING

(75) Inventors: Erzhen Gao, Milburn, NJ (US); Qiyuan Ma, Milburn, NJ (US)

(73) Assignee: Time Medical Holdings Company Limited, George Town, KY (US)

( * ) Notice: Subject to any disclaimer, the term of this patent is extended or adjusted under 35 U.S.C. 154(b) by 520 days.

This patent is subject to a terminal disclaimer.

(21) Appl. No.: 12/762,901

(22) Filed: Apr. 19, 2010

(65) Prior Publication Data

US 2011/0012599 A1  Jan. 20, 2011

Related U.S. Application Data

(60) Provisional application No. 61/170,135, filed on Apr. 17, 2009.

(51) Int. Cl.
*G01V 3/00* (2006.01)

(52) U.S. Cl.
USPC .......................................................... 324/318

(58) Field of Classification Search
USPC ................................................. 324/300–322
See application file for complete search history.

(56) References Cited

U.S. PATENT DOCUMENTS

| | | | |
|---|---|---|---|
| 4,652,824 A | 3/1987 | Oppelt | |
| 5,289,128 A | 2/1994 | DeMeester et al. | |
| 5,661,445 A | 8/1997 | Larson, III et al. | |
| 5,793,210 A | 8/1998 | Pla et al. | |
| 6,411,092 B1 | 6/2002 | Anderson | |
| 6,879,852 B1 | 4/2005 | Mueller | |
| 7,042,216 B2 | 5/2006 | Barbic | |
| 7,403,003 B2 * | 7/2008 | Kimmlingen et al. | 324/307 |
| 7,417,434 B2 * | 8/2008 | Overweg | 324/318 |

(Continued)

FOREIGN PATENT DOCUMENTS

| | | |
|---|---|---|
| EP | 0 562 708 A1 | 9/1993 |
| FR | 2 622 427 A1 | 5/1989 |
| GB | 2 301 674 A | 12/1996 |

OTHER PUBLICATIONS

Jing Yuan and G X Shen, "Gradient coil design using Bi-2223 high temperature superconducting tape for magnetic resonance imaging," Medical Engineering & Physics, 2007, pp. 442-448, vol. 29, Butterworth-Heinemann, GB.

(Continued)

*Primary Examiner* — Dixomara Vargas
(74) *Attorney, Agent, or Firm* — Frommer Lawrence & Haug LLP; David V. Rossi

(57) ABSTRACT

Methods and/or apparatuses for magnetic resonance imaging (MRI) and/or magnetic resonance spectroscopy comprising a superconducting gradient coil module configured for cryogenic cooling. Such a superconducting gradient coil module may comprise a vacuum thermal isolation housing comprising a double wall hermetically sealed jacket that (i) encloses a hermetically sealed interior space having a first vacuum pressure, and (ii) substantially encloses a vacuum space having a second vacuum pressure; at least one superconductor gradient coil disposed in the vacuum space; a thermal sink member disposed in the vacuum space and in thermal contact with the at least one superconductor gradient coil; and a port configured for cryogenically cooling at least the thermal sink member.

20 Claims, 6 Drawing Sheets

(56) References Cited

U.S. PATENT DOCUMENTS

| | | | |
|---|---|---|---|
| 7,759,935 | B2 | 7/2010 | DeVries et al. |
| 2004/0222186 | A1 | 11/2004 | Cheng et al. |
| 2009/0189721 | A1 | 7/2009 | Chiba et al. |
| 2010/0248968 | A1 | 9/2010 | Stautner |
| 2011/0011102 | A1* | 1/2011 | Gao et al. .................. 62/51.1 |

OTHER PUBLICATIONS

R.D. Black et al, A High-Temperature Superconducting Receiver for Nuclear Magnetic Resonance Microscopy, Science, Feb. 5, 1993, pp. 793-795, vol. 259.

PCT International Search Report mailed Jun. 24, 2010 in counterpart International Application No. PCT/US2010/026811, filed Mar. 10, 2010.

PCT Written Opinion of the International Searching Authority mailed Jun. 24, 2010 in counterpart International Application No. PCT/US2010/026811, filed Mar. 10, 2010.

PCT International Search Report mailed Jun. 21, 2010 in International Application. No. PCT/US2010/031611, filed Apr. 19, 2010.

PCT Written Opinion of the International Searching Authority mailed Jun. 21, 2010 in International Application No. PCT/US2010/031611, filed Apr. 19, 2010.

Espacenet English-language Abstract of FR2622427A1, May 5, 1989.

* cited by examiner

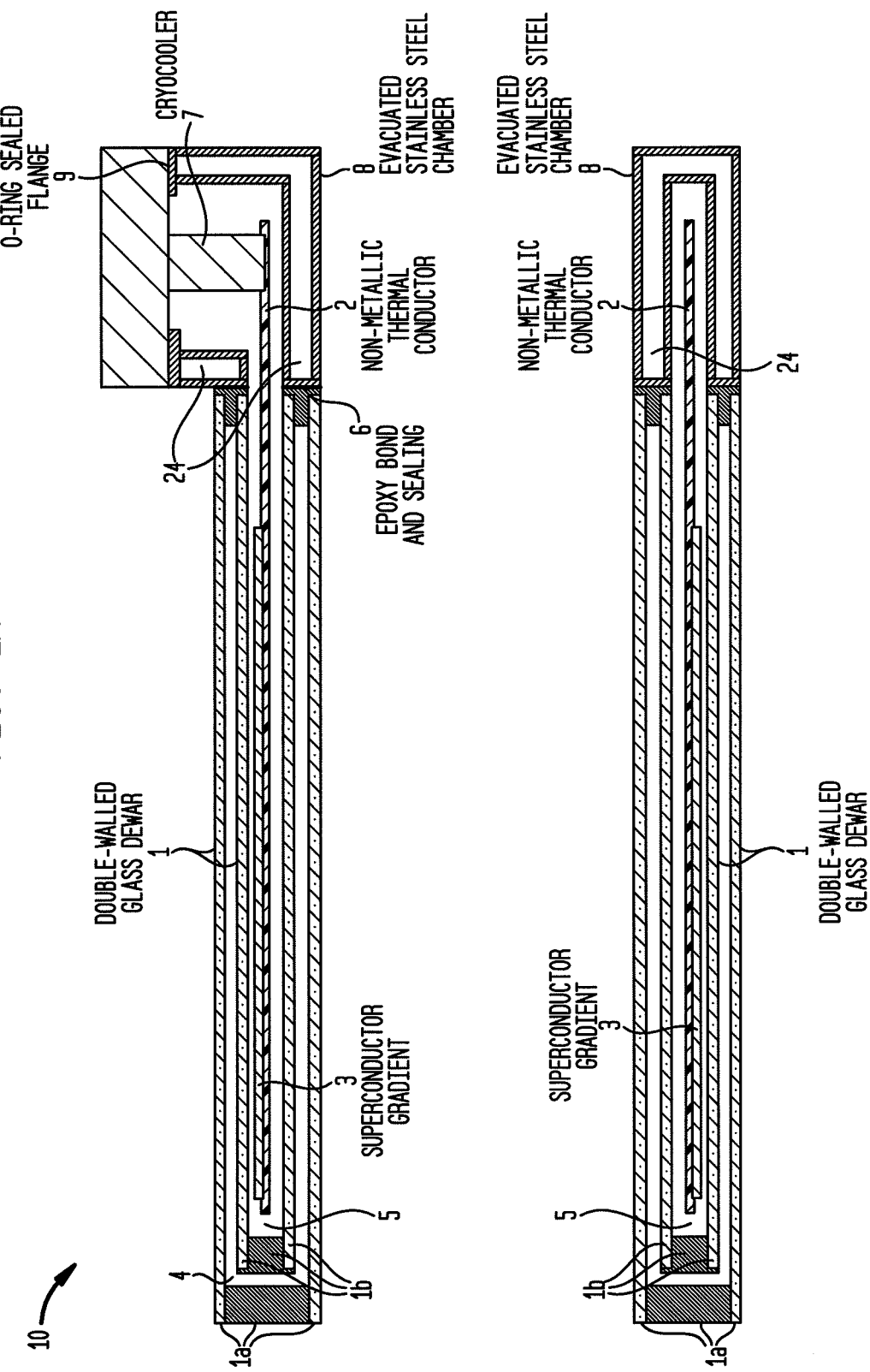

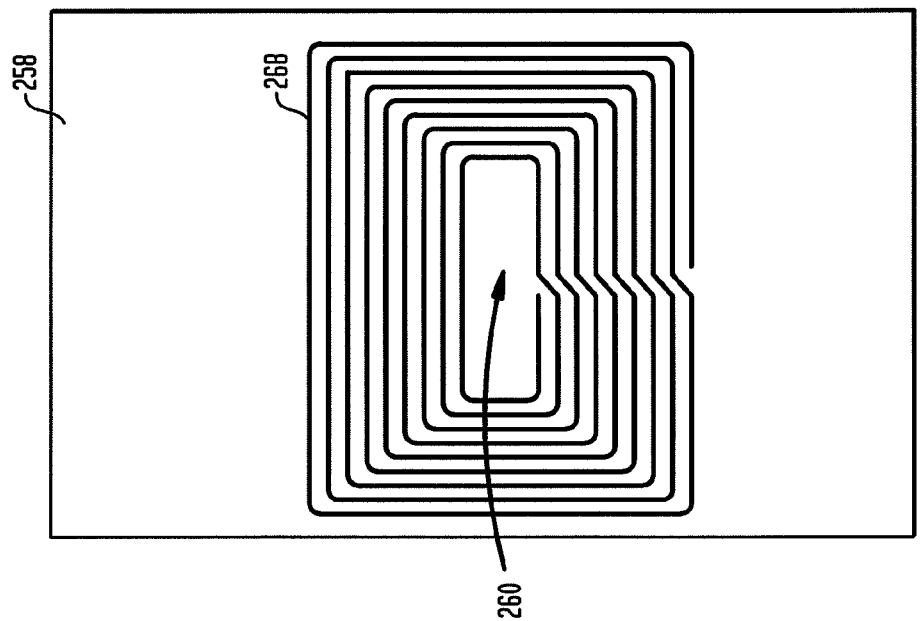
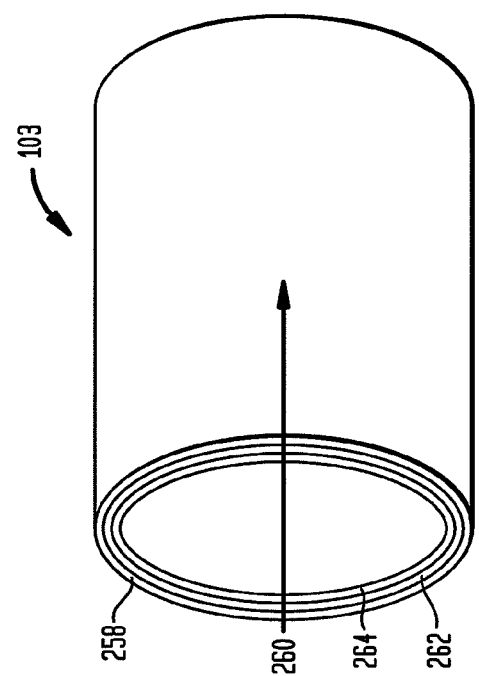

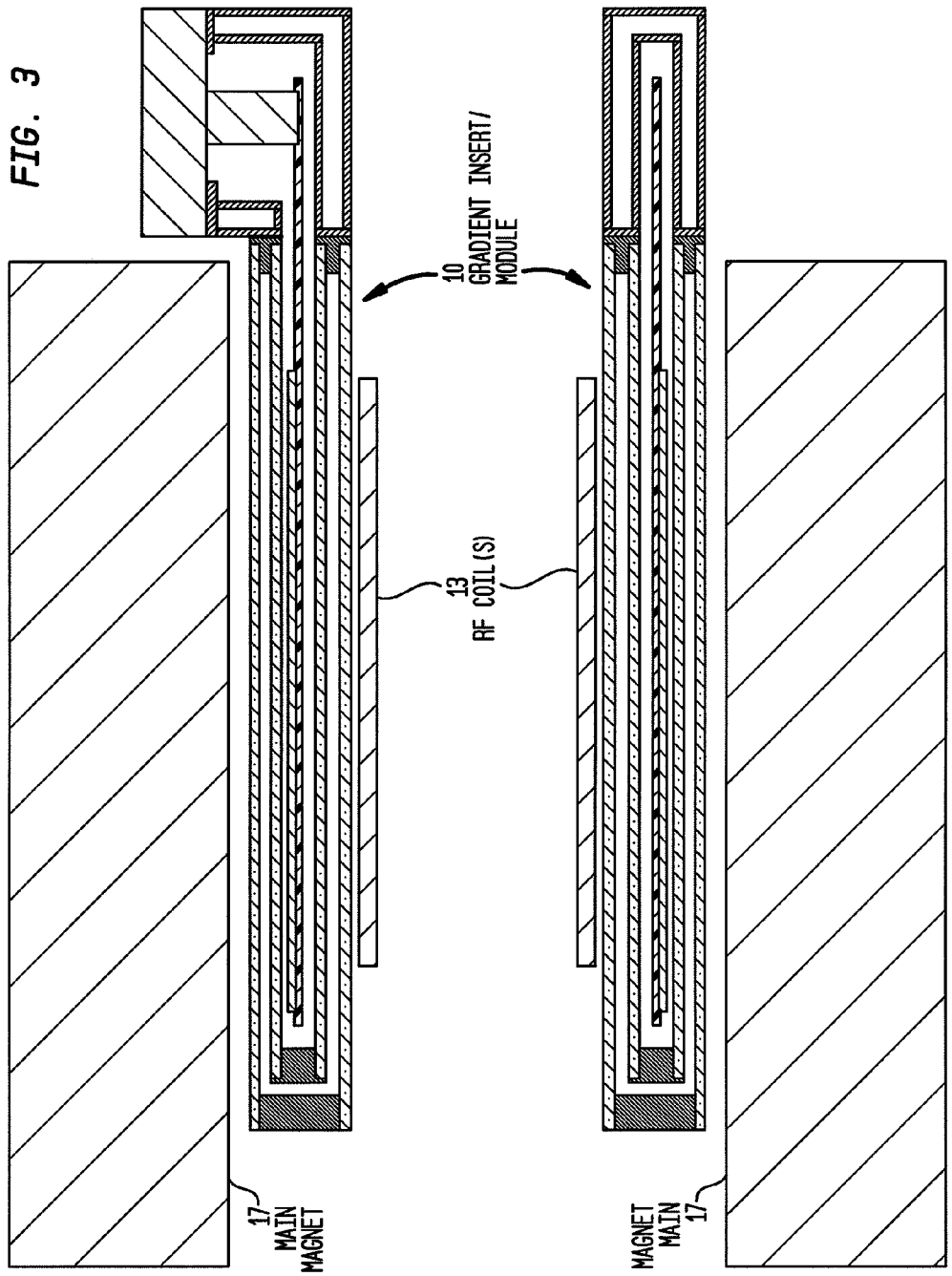

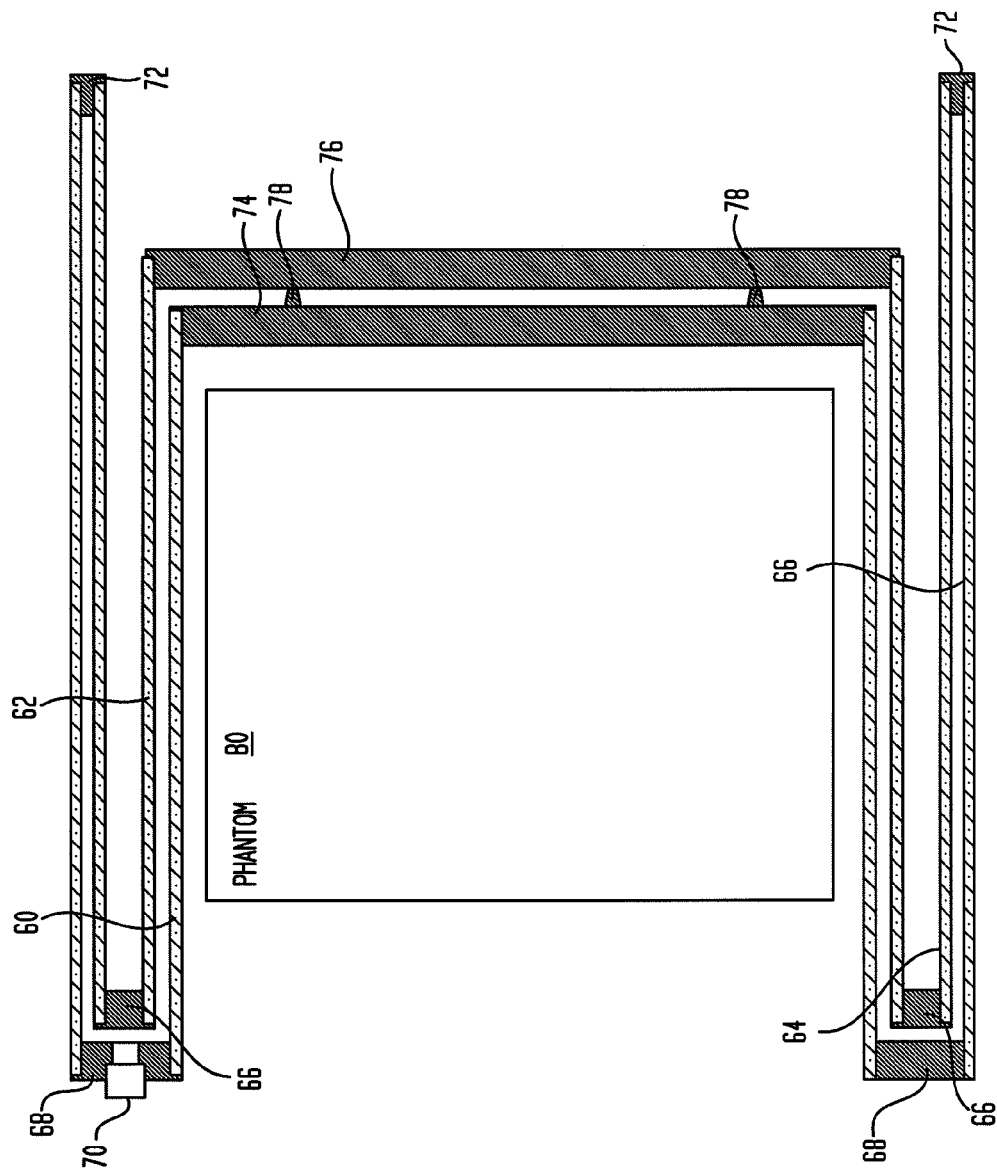

CRYOGENICALLY COOLED SUPERCONDUCTOR GRADIENT COIL MODULE FOR MAGNETIC RESONANCE IMAGING

RELATED APPLICATIONS

This application claims the benefit of U.S. Provisional Application No. 61/170,135, filed Apr. 17, 2009, which is incorporated herein by reference in its entirety.

TECHNICAL FIELD

The present invention relates generally to magnetic resonance imaging and spectroscopy, and, more particularly, to magnetic resonance imaging and spectroscopy apparatus employing superconductor components, and to methods for manufacturing such apparatus.

BACKGROUND

Magnetic Resonance Imaging (MRI) technology is commonly used today in larger medical institutions worldwide, and has led to significant and unique benefits in the practice of medicine. While MRI has been developed as a well-established diagnostic tool for imaging structure and anatomy, it has also been developed for imaging functional activities and other biophysical and biochemical characteristics or processes (e.g., blood flow, metabolites/metabolism, diffusion), some of these magnetic resonance (MR) imaging techniques being known as functional MRI, spectroscopic MRI or Magnetic Resonance Spectroscopic Imaging (MRSI), diffusion weighted imaging (DWI), and diffusion tensor imaging (DTI). These magnetic resonance imaging techniques have broad clinical and research applications in addition to their medical diagnostic value for identifying and assessing pathology and determining the state of health of the tissue examined.

During a typical MRI examination, a patient's body (or a sample object) is placed within the examination region and is supported by a patient support in an MRI scanner where a substantially constant and uniform primary (main) magnetic field is provided by a primary (main) magnet. The magnetic field aligns the nuclear magnetization of processing atoms such as hydrogen (protons) in the body. A gradient coil assembly within the magnet creates a small variation of the magnetic field in a given location, thus providing resonance frequency encoding in the imaging region. A radio frequency (RF) coil is selectively driven under computer control according to a pulse sequence to generate in the patient a temporary oscillating transverse magnetization signal that is detected by the RF coil and that, by computer processing, may be mapped to spatially localized regions of the patient, thus providing an image of the region-of-interest under examination.

In a common MRI configuration, the static main magnetic field is typically produced by a solenoid magnet apparatus, and a patient platform is disposed in the cylindrical space bounded by the solenoid windings (i.e. the main magnet bore). The windings of the main field are typically implemented as a low temperature superconductor (LTS) material, and are super-cooled with liquid helium in order to reduce resistance, and, therefore, to minimize the amount of heat generated and the amount of power necessary to create and maintain the main field. The majority of existing LTS superconducting MRI magnets are made of a niobium-titanium (NbTi) and/or $Nb_3Sn$ material which is cooled with a cryostat to a temperature of 4.2 K.

As is known to those skilled in the art, the magnetic field gradient coils generally are configured to selectively provide linear magnetic field gradients along each of three principal Cartesian axes in space (one of these axes being the direction of the main magnetic field), so that the magnitude of the magnetic field varies with location inside the examination region, and characteristics of the magnetic resonance signals from different locations within the region of interest, such as the frequency and phase of the signals, are encoded according to position within the region (thus providing for spatial localization). Typically, the gradient fields are created by current passing through coiled saddle or solenoid windings, which are affixed to cylinders concentric with and fitted within a larger cylinder containing the windings of the main magnetic field. Unlike the main magnetic field, the coils used to create the gradient fields typically are common room temperature copper windings. The gradient strength and field linearity are of fundamental importance both to the accuracy of the details of the image produced and to the information on tissue chemistry (e.g., in MRSI).

Since MRI's inception, there has been a relentless pursuit for improving MRI quality and capabilities, such as by providing higher spatial resolution, higher spectral resolution (e.g., for MRSI), higher contrast, and faster acquisition speed. For example, increased imaging (acquisition) speed is desired to minimize imaging blurring caused by temporal variations in the imaged region during image acquisition, such as variations due to patient movement, natural anatomical and/or functional movements (e.g., heart beat, respiration, blood flow), and/or natural biochemical variations (e.g., caused by metabolism during MRSI). Similarly, for example, because in spectroscopic MRI the pulse sequence for acquiring data encodes spectral information in addition to spatial information, minimizing the time required for acquiring sufficient spectral and spatial information to provide desired spectral resolution and spatial localization is particularly important for improving the clinical practicality and utility of spectroscopic MRI.

Several factors contribute to better MRI image quality in terms of high contrast, resolution, and acquisition speed. An important parameter impacting image quality and acquisition speed is the signal-to-noise ratio (SNR). Increasing SNR by increasing the signal before the preamplifier of the MRI system is important in terms of increasing the quality of the image. One way to improve SNR is to increase the magnetic field strength of the magnet as the SNR is proportional to the magnitude of the magnetic field. In clinical applications, however, MRI has a ceiling on the field strength of the magnet (the US FDA's current ceiling is 3 T (Tesla)). Other ways of improving the SNR involve, where possible, reducing sample noise by reducing the field-of-view (where possible), decreasing the distance between the sample and the RF coils, and/or reducing RF coil noise.

Despite the relentless efforts and many advancements for improving MRI, there is nevertheless a continuing need for yet further improvements in MRI, such as for providing greater contrast, improved SNR, higher acquisition speeds, higher spatial and temporal resolution, and/or higher spectral resolution.

Additionally, a significant factor affecting further use of MRI technology is the high cost associated with high magnetic field systems, both for purchase and maintenance. Thus, it would be advantageous to provide a high quality MRI imaging system that is capable of being manufactured and/or maintained at reasonable cost, permitting MRI technology to be more widely used.

SUMMARY OF INVENTION

Various embodiments of the present invention provide a superconducting gradient coil module configured for cryogenic cooling, comprising: a vacuum thermal isolation housing comprising a double wall hermetically sealed jacket that (i) encloses a hermetically sealed interior space under a vacuum condition, and (ii) substantially encloses an interior chamber region that is separate from the hermetically sealed interior space and is configured to be evacuated to a vacuum condition; at least one superconductor gradient coil disposed in said interior chamber region and configured for generating one or more magnetic field gradients for at least one of magnetic resonance imaging and magnetic resonance spectroscopy; a thermal sink member disposed in said interior chamber region and in thermal contact with said at least one superconductor gradient coil; and a port configured for cryogenically cooling at least the thermal sink member.

In some embodiments, the port is coupled to a cryocooler that is thermally coupled to at least the thermal sink member. The coupling of the cryocooler to the port may provide for sealing the interior chamber region such that the interior chamber region is under a vacuum condition.

The hermetically sealed jacket may be sealedly joined to a chamber having an interior space that is coextensive with and is configured to be evacuated to substantially the same vacuum condition as the interior chamber region, wherein the port is provided in said chamber. The chamber may be configured as a double walled chamber (e.g., a double-walled stainless steel chamber) that encloses a hermetically sealed intra-wall cavity that is under vacuum.

In accordance with some embodiments, the module may also comprise at least one radiofrequency coil disposed within said interior chamber region, wherein the at least one radiofrequency coil is configured for at least one of generating and receiving a radiofrequency signal for at least one of magnetic resonance imaging and magnetic resonance spectroscopy. One or more of the at least one radiofrequency coil may be and in thermal contact with the thermal sink member. One or more of the at least one radiofrequency coil may comprise a superconductor material, which may be a high temperature superconductor (HTS) material.

Some embodiments of the present invention may comprise a method for magnetic resonance imaging, comprising applying at least one magnetic field gradient within an examination region using at least one respective superconducting gradient field coil that is disposed in an interior chamber region of a superconducting gradient coil module that comprises: a vacuum thermal isolation housing comprising a double wall hermetically sealed jacket that (i) encloses a hermetically sealed interior space under a vacuum condition, and (ii) substantially encloses the interior chamber region that is separate from the hermetically sealed interior space and is under a vacuum condition; a thermal sink member disposed in the interior chamber region and in thermal contact with the at least one superconductor gradient coil; and a port configured for cryogenically cooling at least the thermal sink member to thereby cryogenically cool the at least one respective superconducting gradient field coil that is in thermal contact with said thermal sink member.

The method may further comprise transmitting or receiving, or both transmitting and receiving, radio frequency signals to and/or from the examination region using at least one RF coil that is disposed within said module and is configured for cooling and comprises at least one of (i) a non-superconducting material that when cooled to a temperature below room temperature has a conductivity higher than that of copper at said temperature and (ii) a superconducting material. At least one of the at least one RF coil may be in thermal contact with the thermal sink member.

It will be appreciated by those skilled in the art that the foregoing brief description and the following detailed description are exemplary and explanatory of the present invention, but are not intended to be restrictive thereof or limiting of the advantages which can be achieved by this invention. Additionally, it is understood that the foregoing summary of the invention is representative of some embodiments of the invention, and is neither representative nor inclusive of all subject matter and embodiments within the scope of the present invention. Thus, the accompanying drawings, referred to herein and constituting a part hereof, illustrate embodiments of this invention, and, together with the detailed description, serve to explain principles of embodiments of the invention. Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures.

BRIEF DESCRIPTION OF THE DRAWINGS

Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures, and wherein:

FIGS. 1A and 1B schematically depict orthogonal views of an illustrative cryogenically cooled superconducting gradient coil module, in accordance with some embodiments of the present invention;

FIG. 2A schematically depicts gradient coils corresponding to gradient coils of the cryogenically cooled superconductor gradient coil module of FIGS. 1A and 1B, in accordance with some embodiments of the present invention;

FIG. 2B schematically illustrates a portion of a cylindrical x-gradient support of FIG. 2A depicted in a plan view, showing a coil which is one quarter of the overall x-gradient coil, in accordance with some embodiments of the present invention;

FIG. 3 schematically depicts a cross-sectional view of an illustrative MRI system that comprises the gradient coil module of FIGS. 1A and 1B, in accordance with some embodiments of the present invention;

FIG. 5 schematically illustrates a glass dewar portion of a cryogenically cooled superconducting gradient coil module designed for use in a magnetic resonance imaging system dedicated to head imaging, in accordance with some embodiments of the present invention.

DESCRIPTION OF EMBODIMENTS OF THE INVENTION

As will be understood by those skilled in the art in view of the ensuing description, cryogenically cooled superconducting gradient coil modules (e.g., inserts) according to various embodiments of the present invention may be implemented in myriad magnetic resonance imaging and spectroscopy systems, such as systems employing conventional copper RF coils, systems employing superconducting RF coils (e.g., such as in systems disclosed in U.S. patent application Ser. No. 12/416,606, filed Apr. 1, 2009, which is hereby incorporated by reference), whole body systems, dedicated systems (e.g., limb-only, head-only, pet, infant), systems with a vertically or horizontally oriented main magnetic field, open or closed systems, etc. Similarly, it will also be understood by those skilled in the art that while various portions of the ensuing description may be set forth in the context of an MRI system that may be used for structural examination of a patient, cryogenically cooled superconducting gradient coil modules according to various embodiments of the present invention may be employed in connection with magnetic resonance (MR) systems operated and/or configured for other modalities, such as functional MRI, diffusion weighted and/or diffusion tensor MRI, MR spectroscopy and/or spectroscopic imaging, etc. Additionally, as used herein, MRI includes and embraces magnetic resonance spectroscopic imaging, diffusion tensor imaging (DTI), as well as any other imaging modality based on nuclear magnetic resonance.

Figure 1B:
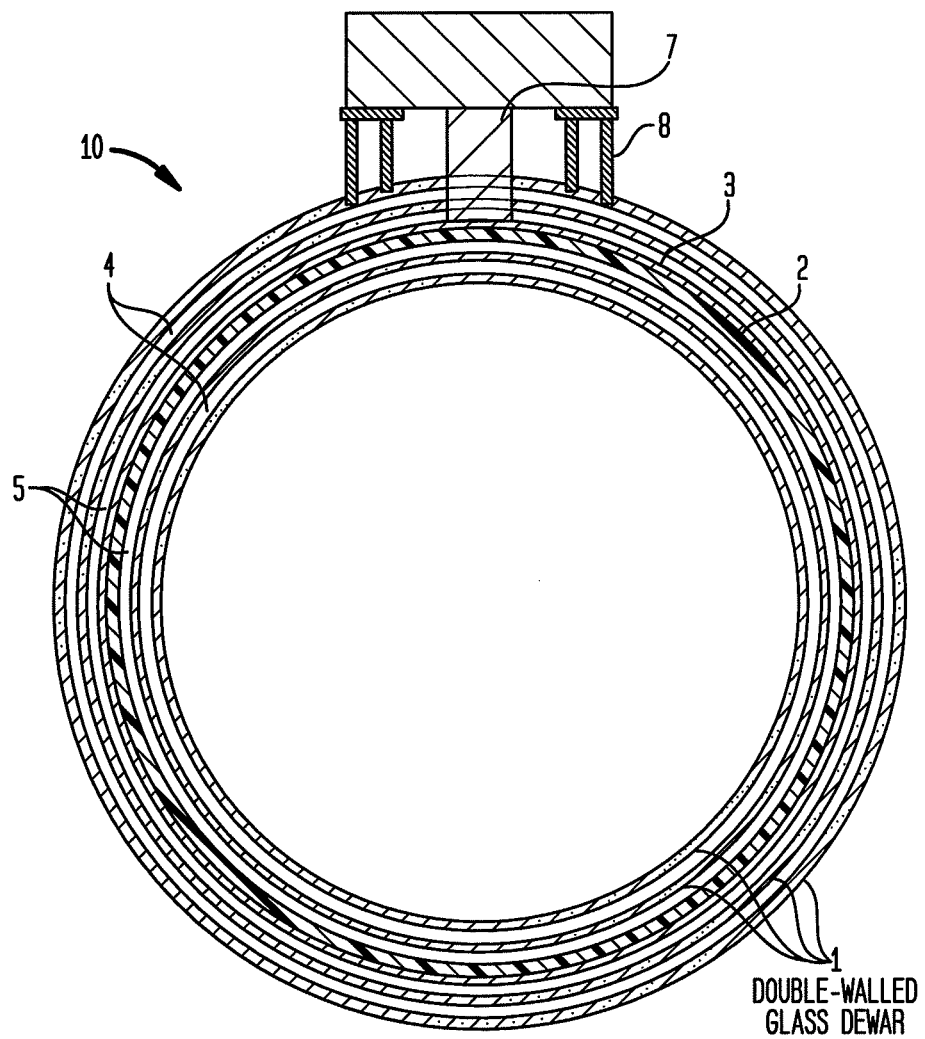

FIGS. 1A and 1B schematically depict orthogonal views of an illustrative cryogenically cooled superconducting gradient coil module 10 having a generally cylindrical shape, in accordance with some embodiments of the present invention. More specifically, FIG. 1A is a cross-sectional view along the longitudinal axis, whereas FIG. 1B is generally a plan or end-on view, viewed from the left-hand side of FIG. 1A, but showing a cut-away or cross-section of stainless steel chamber 8 to reveal the portion of cryocooler 7 within the chamber 8.

As depicted in FIGS. 1A and 1B, in some embodiments cryogenically cooled superconducting gradient coil module 10 includes (i) a double-walled Dewar 1 made of glass and/or other non-conductive, mechanically strong materials, such as G10, RF4, plastic, and/or ceramic; (ii) a non-metallic thermal conductor 2, such as a high thermal conductivity ceramic, such as sapphire or alumina; (iii) superconductor gradient coils 3 (i.e., three gradients generating B-field variations in orthogonal x-, y-, z-directions) that are in good thermal contact with thermal conductor 2 and made of, for example, low temperature superconductor (LTS) wire, such as NbTi, Nb3Sn, etc., or high temperature superconductor (HTS) tape, such as YBCO, BSCCO, etc.; (iv) a double-walled stainless steel chamber 8 that is sealably coupled to double-walled Dewar 1; and (v) a cryocooler 9 thermally coupled to thermal conductor 2 and sealably mounted to a flange of stainless steel chamber 8.

It will be understood that double-walled Dewar 1 may be constructed, in a variety of ways, as a continuous, hermetically sealed glass housing enclosing an interior chamber (or cavity) 4 in which at least a low vacuum condition and, in accordance with some embodiments, preferably at least a high vacuum condition (e.g., about $10^{-6}$ Torr or lower pressure) is maintained. For example, in accordance with some embodiments, double-walled Dewar 1 may be manufactured as follows: (i) forming two generally cylindrical double-walled structures each having a generally U-shaped wall cross-section, the first corresponding to continuous glass wall portion 1a and the second corresponding to continuous wall portion 1b, (ii) fitting the generally cylindrical continuous glass wall portion 1b into the annular space of generally cylindrical continuous glass wall portion 1a, possibly using glass spacers therebetween, and (iii) pumping the cavity 4 to a high vacuum and glass-bonding, fusing, or otherwise sealing the open end between 1a and 1b (i.e., the end that is later sealably mounted to stainless steel chamber 8) to hermetically seal cavity 4 under high vacuum. It may be appreciated that the vacuum sealing step may be performed in myriad ways. For example, it may be performed entirely within a vacuum chamber, or the ends of 1a and 1b may be fused to each other except for a small region that is used as a vacuum pumping port and that is sealed after pumping the cavity to high vacuum therethrough. In various embodiments, double-walled Dewar 1 may be implemented in accordance with, or similar to, the hermetically sealed double-walled structures (and vacuum thermal isolation housing) described in U.S. application Ser. No. 12/212,122, filed Sep. 17, 2008, and in U.S. application Ser. No. 12/212,147, filed Sep. 17, 2008, each of which is herein incorporated by reference in its entirety.

By way of example, the joint between the hermetically sealed double-walled Dewar 1 (e.g., glass) and the stainless steel chamber may be formed by epoxy bonding (e.g., epoxy bond/seal 6 in FIG. 1A), welding, or other hermetically sealed flange connection, providing a sufficient seal to maintain at least a low vacuum condition (e.g, about $10^{-2}$ to about $10^{-5}$ Torr) in the interior chamber portion 5 that houses the gradient coils 3 and thermal conductor 2. Also by way of example, the vacuum seal between cryocooler 9 and the flange of stainless steel chamber 8 may be provided by an O-ring or other sealing mechanism (e.g., metal gasket/knife-edge connection) to, similarly, maintain the at least low vacuum condition in the interior chamber portion 5 that houses the gradient coils 3 and thermal conductor 2. Those skilled in the art understand, however, that chamber 8 may be made of materials other than stainless steel, e.g., aluminum or other metallic or other non-metallic material, such as glass, ceramic, plastics, or combination of these materials, and such other materials may be appropriately joined to Dewar 1 and cryocooler 9.

In various embodiments, cryocooler 9 may be implemented as any of various single stage or multi-stage cryocoolers, such as, for example, a Gifford McMahon (GM) cryocooler, a pulse tube (PT) cooler, a Joule-Thomson (JT) cooler, a Stirling cooler, or other cryocooler. In various alternative embodiments, the gradient coil module 10 may be configured for cooling such that coils 3 are cooled by a cryogen, such as liquid helium and liquid nitrogen.

Referring now to FIG. 2A, gradient coils 103, corresponding to gradient coils 3 of illustrative cryogenically cooled superconductor gradient coil module 10 of FIGS. 1A and 1B, are depicted in more detail in an oblique view, in accordance with some embodiments of the present invention. In such embodiments, as depicted in FIG. 2A, three independent gradient coils for creating magnetic field variations along three orthogonal directions are formed or otherwise provided on and/or within the surfaces of three respective coaxial cylindrical support structures, namely, x-gradient support 258, y-gradient support 262, and z-gradient support 264. In accordance with typical convention, x- and y-indicate the two orthogonal directions perpendicular to the main magnetic field (sometimes referred to as the transverse directions), and z-indicates the direction of the main magnetic field. Thus, the x-gradient support 258, y-gradient support 262, and z-gradient support 264 support respective gradient coils for providing magnetic field gradients along the x-, y-, and z-directions, respectively. The gradient supports 258, 262, and 264 may be made of, for example, G10 or other non-ferromagnetic, non-conductive (e.g., non-metallic, insulating) material. In this embodiment, the z-gradient coil is a solenoid coil, and the x- and y-gradient coils are saddle coils that each span or cover about half of their respective cylindrical supports in the circumferential direction. The y-gradient support 262 is mounted in good thermal contact to x-gradient support 258 and to z-gradient support 264, which is mounted in good thermal contact to thermal sink 110 (corresponding to thermal conductor 2 in FIGS. 1A and 1B). In various alternative embodiments, a heat sink may be additionally or alternatively mounted in contact with x-gradient support 258. When implemented in addition to thermal sink 110 (thermal conductor 2), such a heat sink in contact with x-gradient support 258 may be cooled either by the same cryocooler that cools thermal sink 110 (thermal conductor 2) or by a separate cryocooler.

FIG. 2B schematically illustrates a portion of cylindrical x-gradient support 258 of FIG. 2A depicted in a plan view, showing a coil 268 which is one quarter of the overall x-gradient coil that is supported by x-gradient support 258, in accordance with an embodiment of the present invention. The surface of the x-gradient support 258 is usually recessed (e.g., etched or carved) where the gradient coil 268 (wire) is located, and the gradient coil wire is fixed and bonded in the recess so the wire will not move when current conducts through the gradient coil wire in the magnetic field (e.g., resulting in a Lorentz force). The y-oriented gradient coil provided on y-gradient support 262 has essentially the same design and construction as the x-oriented gradient coil 268 on x-gradient support 258, except for slight dimensional variations to account for the slightly smaller diameter of the y-gradient support compared to that of the x-oriented gradient support. The center 260 of the x-gradient coil 268 is facing the x-direction as indicated by FIGS. 2A and 2B, and the y-gradient coil is displaced 90° circumferentially relative to the x-gradient coil. The solenoidal z-gradient coil (not shown in detail) is similarly fabricated on and/or within the surface of the z-gradient support 264, but with the z-gradient coil wound helically about the cylindrical axis of z-gradient support 264, with half of the coil along the cylindrical axis wound in the same direction as the main magnet winding such that the z-gradient coil increases the magnetic field within this half of the coil, and with the other half of the coil along the cylindrical axis wound in the opposite direction such that the z-gradient coil decreases the magnetic filed within this other half of the coil.

As will be understood by those skilled in the art, such a generally cylindrically shaped gradient coil module 10 as depicted in FIGS. 1A and 1B according to some embodiments of the present invention is well suited for use, for example, in an MRI system that employs a cylindrical, solenoid main magnet structure that generates a substantially uniform, horizontal magnetic field. For example, such an MRI system is schematically depicted in FIG. 3 in longitudinal cross section, and includes cylindrical main magnet 17 having a bore in which gradient coil module 10 is disposed, and which also includes RF coil(s) 13 (which may be any of various types of RF coil(s) or coil array configurations for whole-body, dedicated body part (e.g., head or limb), infant, or pet, etc, imaging applications. It will be understood, however, that cryogenically cooled superconducting gradient coil module 10 may be implemented with main magnet configurations other than a cylindrical, solenoid magnet that provides horizontal fields and/or, for example, may be implemented with open magnet, such as vertical magnet or a double-donut magnet.

Figure 4:
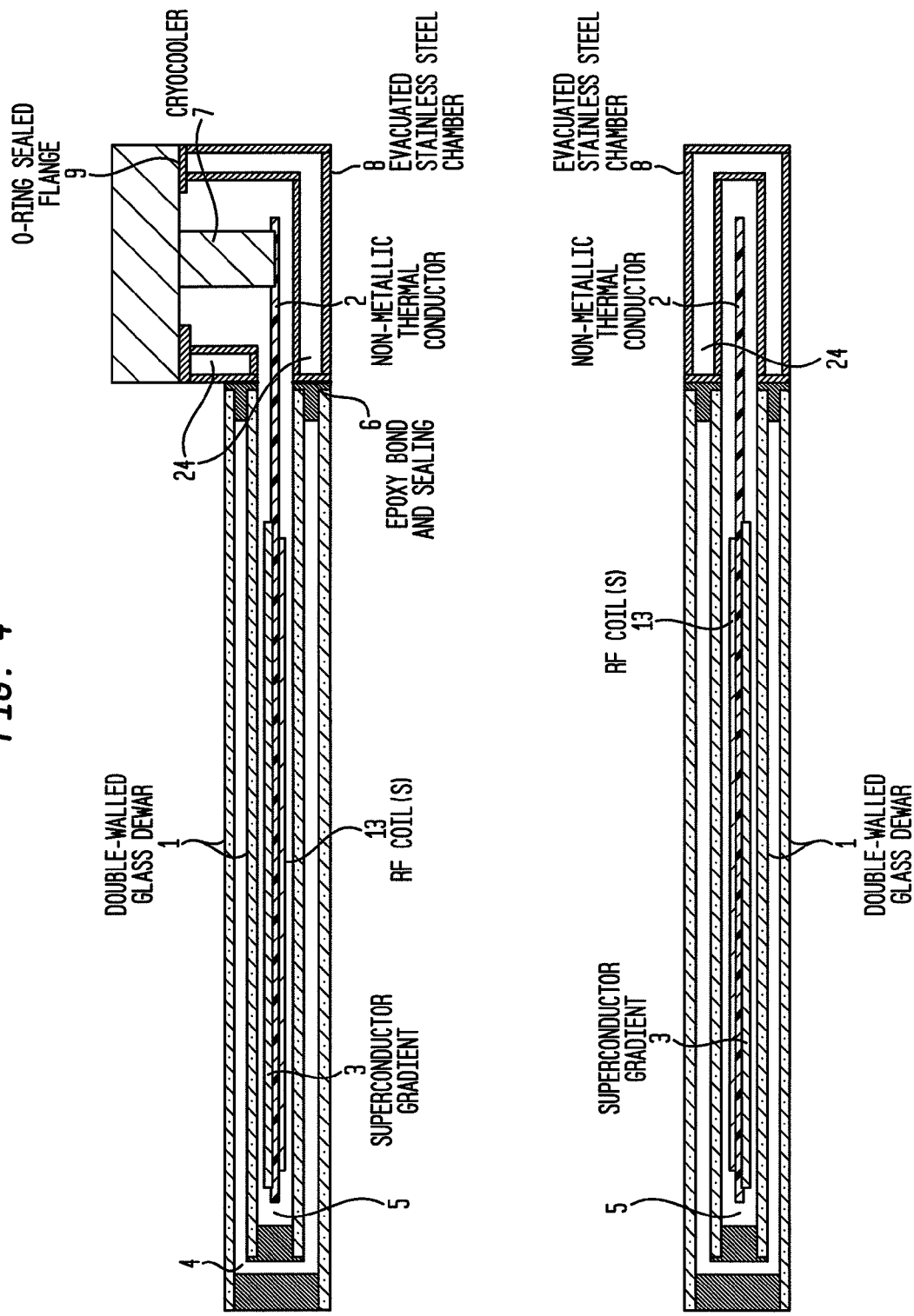
FIG. 4 schematically depicts a cross-sectional view of a cryogenically cooled superconducting gradient coil module comprising at least one RF coil disposed therein, in accordance with some embodiments of the present invention.

It will also be understood that while the embodiments shown in FIGS. 1A-B and FIG. 3 are configured for use with one or more RF coils that are external to cryogenically cooled superconducting gradient coil module 10, in accordance with some embodiments of the present invention one or more RF coils may alternatively or additionally be disposed within the gradient coil module. For example, in accordance with some embodiments such as depicted in FIG. 4, RF coil(s) 13 is/are disposed in good thermal contact with the same heat sink (i.e. thermal conductor 2) that is in thermal contact with superconductor gradient coils 3. In various embodiments, RF coil (s) 13 disposed in thermal contact with thermal conductor 2, and thus subject to cryogenic cooling, may be implemented as one or more conventional copper coil and/or as one or more superconductor RF coil (LTS and/or HTS) and/or as one or more coils comprising a non-superconducting material that when cooled to a temperature below room temperature has a conductivity higher than that of copper at the temperature below room temperature (e.g., carbon nano-tube based materials and/or two-dimensional electron gas semiconductor structures).

By way of example, a suitable form of an HTS RF coil for this application is a superconductor tape made by, for example, Bismuth Strontium Calcium Copper Oxides (BSCCO). For example, detailed teaching of fabricating HTS RF coils from HTS tape is described in U.S. Pat. No. 6,943, 550, the disclosure of which is incorporated herein by reference. In alternative embodiments, the superconductor RF coil may be implemented as a superconductor thin film, such as a superconductor thin film comprising an HTS material such as Yttrium Barium Copper Oxide (YBCO), Thallium-Barium-Calcium-Copper Oxide (TBCCO), $MgB_2$, or MB, wherein M is selected from the group consisting of Be, Al, Nb, Mo, Ta, Ti, Hf, V, and Cr. Detailed teaching of fabricating HTS film coil on a flat substrate is described in Ma et al., "Superconducting MR Surface Coils for Human Imaging," Proc. Mag. Res. Medicine, 1, 171 (1999) and the disclosure of which is incorporated herein by reference in its entirety. Additional teachings concerning HTS coils are described in Ma et al., "Superconducting RF Coils for Clinical MR Imaging at Low Field," Academic Radiology, vol. 10, no., 9, September 2003, pp. 978-987, and in Miller et al., "Performance of a High Temperature Superconducting Probe for In Vivo Microscopy at 2.0 T," Magnetic Resonance in Medicine, 41:72-79 (1999), the disclosures of which are incorporated herein by reference in their entirety.

As will be understood by those skilled in the art, regardless of whether RF coil 13 is within or without gradient module 10, RF coil 13 may be implemented as separate coils for the RF transmitter and the RF receiver, or as a common coil for both the transmitter and the receiver (i.e., a transceiver coil). Additionally, in some embodiments where the transmitter and receiver coils are separate coils, only one of the coils (e.g., the receiver coil) may be implemented as a superconducting coil (e.g., the other coil may be implemented as a conventional copper coil disposed, for example, external to gradient module 10, whereas the superconducting coil may, for example, be disposed on thermal conductor 2 within gradient module 10). Additionally, in some embodiments, regardless of whether RF coil 13 is within or without module 10, it may be implemented as an RF coil array, which, in some embodiments may be a superconductive RF coil array, such as an HTS coil array.

Additionally, it will be understood that the dimensions and shape of a cryogenically cooled superconducting gradient coil module may be modified depending on the application. For example, FIG. 5 schematically illustrates, in accordance with some embodiments of the present invention, a glass dewar portion of a cryogenically cooled superconducting gradient coil module designed for use in a magnetic resonance imaging system dedicated to head imaging, wherein the glass dewar components may have the following approximate dimensions, provided by way of example only: cylinder 60 has an inner diameter, outer diameter, and axial length of 230 mm, 236 mm, and 254 mm, respectively; cylinder 62 has an inner diameter, outer diameter, and axial length of 246 mm, 252 mm, and 254 mm, respectively; cylinder 64 has an inner diameter, outer diameter, and axial length of 280 mm, 286 mm, and 312 mm, respectively; cylinder 66 has an inner diameter, outer diameter, and axial length of 296 mm, 302 mm, and 330 mm, respectively; inner bottom plate (circular/cylindrical) 74 has a diameter of 236 mm and a thickness of 12.7 mm; outer bottom plate (circular/cylindrical) 76 has a diameter of 252 mm and a thickness of 12.7 mm; ring (annular) 66 has an inner diameter, outer diameter, and thickness (axial) of 246 mm, 286 mm, and 12.7 mm, respectively; ring (annular) 68 has an inner diameter, outer diameter, and thickness (axial) of 230 mm, 302 mm, and 12.7 mm, respectively; and ring (annular) 72 has an inner diameter, outer diameter, and thickness (axial) of 280 mm, 302 mm, and 12.7 mm, respectively. Also shown are two of eight small spacer disks 78, having an approximate diameter of 5 mm as well as a height that provides for a gap of about 5 mm between the inner bottom plate 74 and outer bottom plate 76. In this illustrative embodiment, a plug 70 seals off a standard vacuum port in ring 68 through which the intra-dewar cavity is evacuated.

It is further understood that while not shown in the drawings, a cryogenically cooled superconductor gradient coil module (e.g., module 10) in accordance with various embodiments of the present invention includes at least one electrical feedthrough (e.g., through chamber 8) to provide for coupling electrical signals into the module (e.g., for driving the gradient coils, for controlling and/or monitoring any sensors (e.g., pressure and/or temperature, etc.) that may be provided in the module). It is also understood that in accordance with various embodiments of the present invention, a gradient coil module (e.g., module 10) having a glass dewar may include (i) a coating (e.g., plastic or polymer) formed on the glass to provide protection (e.g., against breaking, chipping, or cracking) and/or additional strength etc., and/or (ii) a rigid sleeve (e.g., formed of plastic or G10) may be provided into which the glass dewar fits to provide for such protection and/or additional strength.

The present invention has been illustrated and described with respect to specific embodiments thereof, which embodiments are merely illustrative of the principles of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with the claims that follow.

What is claimed is:

1. A superconducting gradient coil module configured for cryogenic cooling, comprising:
    a vacuum thermal isolation housing comprising a double wall hermetically sealed jacket that (i) encloses a hermetically sealed interior space under a vacuum condition, and (ii) substantially encloses an interior chamber region that is separate from the hermetically sealed interior space and is configured to be evacuated to a vacuum condition;
    at least one superconductor gradient coil disposed in said interior chamber region and configured for generating one or more magnetic field gradients for at least one of magnetic resonance imaging and magnetic resonance spectroscopy;
    a thermal sink member disposed in said interior chamber region and in thermal contact with said at least one superconductor gradient coil; and
    a port configured for cryogenically cooling at least the thermal sink member.

2. The module according to claim 1, wherein the port is coupled to a cryocooler that is thermally coupled to at least the thermal sink member.

3. The module according to claim 2, wherein the coupling of the cryocooler to the port provides for sealing said interior chamber region such that the interior chamber region is under a vacuum condition.

4. The module according to claim 1, wherein said hermetically sealed jacket is sealedly joined to a chamber having an interior space that is coextensive with and is configured to be evacuated to substantially the same vacuum condition as said interior chamber region, wherein said port is provided in said chamber.

5. The module according to claim 4, wherein said chamber is configured as a double-walled chamber that encloses a hermetically sealed intra-wall cavity that is under vacuum.

6. The module according to claim 4, wherein the port is coupled to a cryocooler that is thermally coupled to at least the thermal sink member.

7. The module according to claim 6, wherein the coupling of the cryocooler to the port provides for sealing said interior chamber region such that the interior chamber region is under a vacuum condition.

8. The module according to claim 4, wherein the chamber is a double walled stainless steel chamber.

9. The module according to claim 4, wherein the hermetically sealed interior space is under a vacuum condition having a vacuum pressure in the range of about $10^{-6}$ to about $10^{-12}$ Torr, and the interior chamber region is under a vacuum condition having a vacuum pressure in the a range of about $10^{-2}$ to about $10^{-6}$ Torr.

10. The module according to claim 9, wherein said chamber is configured as a double-walled chamber that encloses a hermetically sealed intra-wall cavity that is under vacuum condition having a vacuum pressure in the range of about $10^{-6}$ to about $10^{-12}$ Torr.

11. The module according to claim 1, wherein the hermetically sealed interior space is under a vacuum condition having a vacuum pressure in the range of about $10^{-6}$ to about $10^{-12}$ Torr, and the interior chamber region is under a vacuum condition having a vacuum pressure in the a range of about $10^{-2}$ to about $10^{-6}$ Torr.

12. The module according to claim 1, further comprising at least one radiofrequency coil disposed within said interior chamber region and in thermal contact with said thermal sink member, said at least one radiofrequency coil being configured for at least one of generating and receiving a radiofrequency signal for at least one of magnetic resonance imaging and magnetic resonance spectroscopy.

13. The module according to claim 12, wherein one or more of the at least one radiofrequency coil comprises a superconductor material.

14. The module according to claim 13, wherein the superconductor material comprises an HTS material.

15. The module according to claim 1, wherein at least one of the at least one superconductor gradient coil comprises an HTS material.

16. The module according to claim 15, wherein the HTS material is formed as HTS tape.

17. The module according to claim 16, wherein the HTS material is formed as an HTS thin film.

18. A method for magnetic resonance imaging, comprising:
applying at least one magnetic field gradient within an examination region using at least one respective superconducting gradient field coil that is disposed in an interior chamber region of a superconducting gradient coil module; and providing the superconducting gradient coil module comprising:
a vacuum thermal isolation housing comprising a double wall hermetically sealed jacket that (i) encloses a hermetically sealed interior space under a vacuum condition, and (ii) substantially encloses said interior chamber region that is separate from the hermetically sealed interior space and is under a vacuum condition;
a thermal sink member disposed in said interior chamber region and in thermal contact with said at least one superconductor gradient coil; and
a port configured for cryogenically cooling at least the thermal sink member to thereby cryogenically cool the at least one respective superconducting gradient field coil that is in thermal contact with said thermal sink member.

19. The method according to claim 18, further comprising transmitting or receiving, or both transmitting and receiving, radio frequency signals to and/or from the examination region using at least one RF coil that is disposed within said module and is configured for cooling and comprises at least one of (i) a non-superconducting material that when cooled to a temperature below room temperature has a conductivity higher than that of copper at said temperature and (ii) a superconducting material.

20. The method according to claim 19, wherein at least one of said at least one RF coil is in thermal contact with said thermal sink member.

* * * * *